United States Patent
Cho et al.

(10) Patent No.: US 9,122,352 B2
(45) Date of Patent: *Sep. 1, 2015

(54) OPTICAL TOUCH DEVICE AND METHOD OF FORMING PHOTO SENSOR

(71) Applicant: AU Optronics Corp., Hsin-Chu (TW)

(72) Inventors: An-Thung Cho, Hsin-Chu (TW);
Chia-Tien Peng, Hsin-Chu (TW);
Hung-Wei Tseng, Hsin-Chu (TW);
Cheng-Chiu Pai, Hsin-Chu (TW);
Yu-Hsuan Li, Hsin-Chu (TW);
Chun-Hsiun Chen, Hsin-Chu (TW);
Wei-Ming Huang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/535,334

(22) Filed: Nov. 7, 2014

(65) Prior Publication Data

US 2015/0062088 A1 Mar. 5, 2015

Related U.S. Application Data

(62) Division of application No. 12/718,998, filed on Mar. 7, 2010, now Pat. No. 8,907,923.

(30) Foreign Application Priority Data

Jun. 18, 2009 (TW) .............................. 98120406 A

(51) Int. Cl.
*G06F 3/042* (2006.01)
*H01L 31/028* (2006.01)
*G06F 3/041* (2006.01)
*H01L 31/18* (2006.01)
*H01L 31/20* (2006.01)
*H01L 27/146* (2006.01)

(52) U.S. Cl.
CPC .............. *G06F 3/0421* (2013.01); *G06F 3/042* (2013.01); *G06F 3/0412* (2013.01); *H01L 27/14632* (2013.01); *H01L 27/14678* (2013.01); *H01L 27/14687* (2013.01); *H01L 31/028* (2013.01); *H01L 31/182* (2013.01); *H01L 31/1824* (2013.01); *H01L 31/202* (2013.01); *G06F 2203/04103* (2013.01); *G06F 2203/04109* (2013.01); *H01L 27/14621* (2013.01); *H01L 27/14692* (2013.01)

(58) Field of Classification Search
CPC ..... G06F 3/0421; G06F 3/042; G06F 3/0425; G06F 3/0412; G06F 3/04883; G06F 3/0416; G06F 3/0428
See application file for complete search history.

(56) References Cited

U.S. PATENT DOCUMENTS

| | | | |
|---|---|---|---|
| 4,255,686 A | 3/1981 | Maruyama | |
| 6,472,594 B1 | 10/2002 | Ichinose | |
| 6,680,478 B2 * | 1/2004 | Hwang et al. | 250/338.4 |

(Continued)

*Primary Examiner* — Olga Merkoulova
(74) *Attorney, Agent, or Firm* — Winston Hsu; Scott Margo

(57) ABSTRACT

A method of forming a photo sensor includes the following steps. A substrate is provided, and a first electrode is formed on the substrate. A first silicon-rich dielectric layer is formed on the first electrode for sensing an infrared ray, wherein the first silicon-rich dielectric layer comprises a silicon-rich oxide layer, a silicon-rich nitride layer, or a silicon-rich oxynitride layer. A second silicon-rich dielectric layer is formed on the first silicon-rich dielectric layer for sensing visible light beams, wherein the second silicon-rich dielectric layer comprises a silicon-rich oxide layer, a silicon-rich nitride layer, or a silicon-rich oxynitride layer. A second electrode is formed on the second silicon-rich dielectric layer.

18 Claims, 10 Drawing Sheets

(56) References Cited

U.S. PATENT DOCUMENTS

| | | |
|---|---|---|
| 2008/0100791 A1 | 5/2008 | Chen |
| 2008/0121442 A1 | 5/2008 | Boer |
| 2008/0122803 A1 | 5/2008 | Izadi |
| 2008/0303018 A1 | 12/2008 | Kim |
| 2009/0294885 A1 | 12/2009 | Joshi |
| 2010/0163873 A1* | 7/2010 | Cho et al. ............. 257/53 |

* cited by examiner

# OPTICAL TOUCH DEVICE AND METHOD OF FORMING PHOTO SENSOR

CROSS REFERENCE TO RELATED APPLICATIONS

This application is a divisional of application Ser. No. 12/718,998 filed Mar. 7, 2010, now allowed, which is incorporated by reference herein in its entirety.

BACKGROUND OF THE INVENTION

1. Field of the Invention

This present invention is related to a photo sensor, a method of forming the photo sensor, and a related optical touch device, and more particularly, to a photo sensor having a silicon-rich (Si-rich) dielectric layer, a method of forming the same, and a related optical touch device.

2. Description of the Prior Art

Photo sensors are widely applied in various types of thin film transistor (TFT) display. The current photo sensors mostly use III A group elements and V A group elements to form positive-intrinsic-negative (PIN) diodes. The PIN diode sensors, however, have low optical absorption efficiency and are easily to be influenced by non-target light source (noise), and therefore have low signal to noise ratio. In addition, for the TFT displays, the process adjustment of the PIN diode sensors is limited by the TFT characteristics and the materials of the PIN diode made of III A group element and VA group element. Therefore, the conventional PIN diodes have the limitation in the application and manufacturing capacity.

On the other hand, the industry also develops, utilizing the high photosensitivity of the amorphous silicon ($\alpha$-Si), to fabricate the thin film transistor sensor (TFT sensor) using the amorphous silicon. Please refer to FIG. 1, which is a schematic diagram illustrating a conventional amorphous silicon photo sensor. The conventional amorphous silicon photo sensor 10 includes a first electrode 12, a second electrode 14, and an amorphous silicon layer 16 disposed between the first electrode 12 and the second electrode 14. When visible light beams irradiate on the amorphous silicon layer 16, the amorphous silicon layer 16 can be excited to generate photo current. However, the amorphous silicon TFT sensor also has the disadvantage of low photo current stability. Even without operating the sensor, photo current is easily decreased as time goes by so that the severe reliability issue exists. Besides, the major sensing range of the amorphous silicon TFT sensor is in the visible light range, and the infrared (IR) rays sensing ability of the amorphous silicon TFT sensor is lower. Therefore, the sensing ability of the amorphous silicon TFT sensor is limited.

As a result, the current photo sensors in the industry can no longer fulfill the requirement in many optoelectronic application and new generation photo sensors become the major issue in the research and development.

SUMMARY OF THE INVENTION

It is therefore one objective of the present invention to provide a liquid crystal display panel to solve the aforementioned problems.

According to the present invention, a method of forming the photo sensor according to the embodiment of this invention is also provided. The method includes the following steps. First, a substrate is provided, and a first electrode is formed on the substrate. Then, a first silicon-rich dielectric layer is formed on the first electrode for sensing an infrared ray, wherein the first silicon-rich dielectric layer comprises a silicon-rich oxide layer, a silicon-rich nitride layer, or a silicon-rich oxynitride layer. Subsequently, a second silicon-rich dielectric layer is formed on the first silicon-rich dielectric layer for sensing visible light beams, wherein the second silicon-rich dielectric layer comprises a silicon-rich oxide layer, a silicon-rich nitride layer, or a silicon-rich oxynitride layer. Following that, a second electrode is formed on the second silicon-rich dielectric layer.

In addition, an optical touch device according to the embodiment of this invention is also provided, wherein the optical touch device includes a light source generating device and a display panel. The light source generating device includes a visible light generating component to provide visible light beams and an infrared ray generating component to provide infrared rays. And the display panel includes a display component and a photo sensor, wherein the photo sensor includes a first electrode, a second electrode, a first silicon-rich dielectric layer, and a second silicon-rich dielectric layer. The first silicon-rich dielectric layer is disposed between the first electrode and the second electrode for sensing infrared rays, wherein the first silicon-rich dielectric layer comprises a silicon-rich oxide layer, a silicon-rich nitride layer, or a silicon-rich oxynitride layer. The second silicon-rich dielectric layer is disposed between the first silicon-rich dielectric layer and the second electrode for sensing visible light beams, wherein the second silicon-rich dielectric layer comprises a silicon-rich oxide layer, a silicon-rich nitride layer, or a silicon-rich oxynitride layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
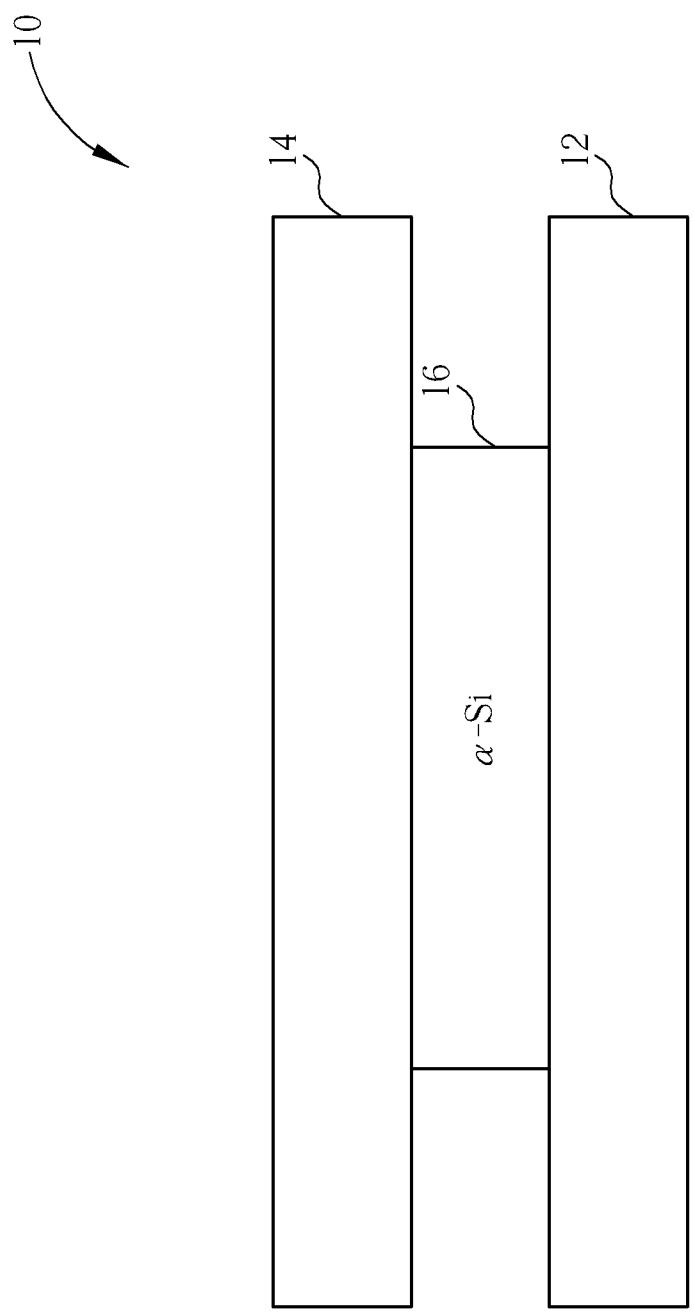
FIG. 1 is a schematic diagram illustrating a conventional amorphous silicon photo sensor.
Figure 2:
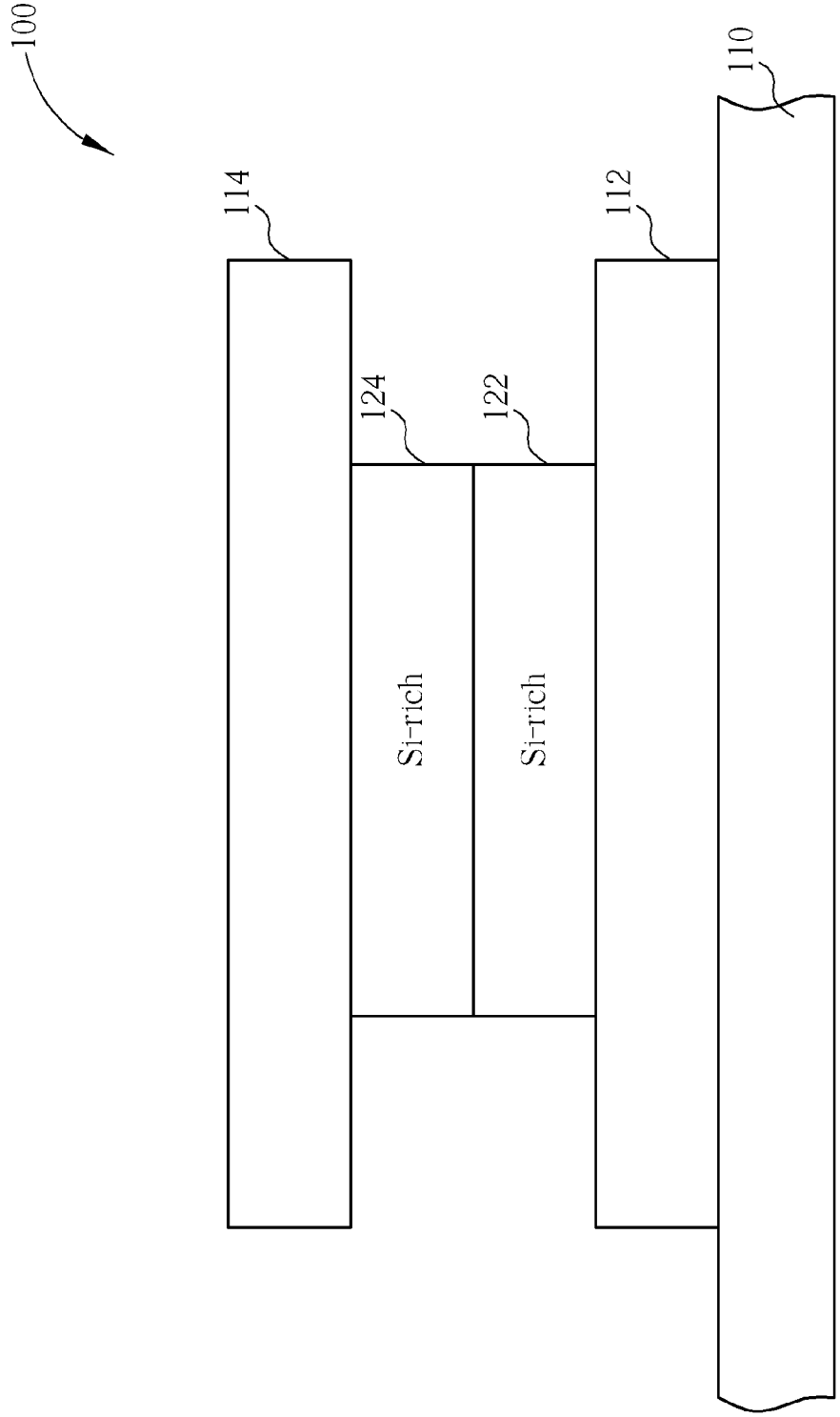
FIG. 2 is a schematic diagram illustrating a method of forming the photo sensor according to a preferred embodiment of the present invention.

Please refer to FIG. 2. FIG. 2 schematically illustrates a method of forming the photo sensor according to a preferred embodiment of the present invention and can accordingly` illustrate the structure of the photo sensor according to the present invention. It should be noted that the diagram is for explanations and is not drawn as original sizes. According to this embodiment, a substrate 110 is provided in this invention and a first electrode 112 is formed on the substrate 110. Then, a first silicon-rich dielectric layer 122 is formed on the first electrode 112 for sensing infrared rays. Subsequently, a second silicon-rich dielectric layer 124 is formed on the first silicon-rich dielectric layer 122 for sensing visible light beams. Following that, a second electrode 114 is formed on the second silicon-rich dielectric layer 124 to fabricate a photo sensor 100. The first silicon-rich dielectric layer 122 or the second silicon-rich dielectric layer 124 is practically not limited to sense infrared rays or visible light beams, respectively. For example, the first silicon-rich dielectric layer 122 or the second silicon-rich dielectric layer 124 can be exchange to sense near-visible light beams or infrared rays (including near-infrared rays), respectively.

In this embodiment, the first silicon-rich dielectric layer 122 has a first percentage of silicon, the second silicon-rich dielectric layer 124 has a second percentage of silicon, and the first percentage of silicon of the first silicon-rich dielectric layer 122 is higher than the second percentage of silicon of the second silicon-rich dielectric layer 124. Therefore, the single photo sensor 100 can effectively sense the signals of both the infrared ray and the visible light. When near-infrared rays, infrared rays, or visible light beams irradiate on the first silicon-rich dielectric layer 122 or the second silicon-rich dielectric layer 124, electron-hole pairs are excited to generate photo current. Based on the materials of the first silicon-rich dielectric layer 122 and the second silicon-rich dielectric layer 124, the refractive index of the first silicon-rich dielectric layer 122 can be higher than the refractive index of the second silicon-rich dielectric layer 124. A preferred structure for each material layer of the photo sensor 100 is described as follows but not limited herein.

The substrate 110 is provided as the substrate of the photo sensor 100 and can be any material, object, or specific region, such as the peripheral circuit region of the array substrate, the display region of the array substrate, or the independent substrate of the touch panel. The first electrode 112 and the second electrode 114 can include transparent materials, and at least one of the first electrode 112 and the second electrode 114 preferably include transparent materials or is made of transparent materials, so that the light signal can pass through the electrode. Take this embodiment as an example. The first electrode 112 preferably includes metal materials which not only provide a low resistance path but also are easily integrated in the manufacturing process of the TFT display. The second electrode 114 preferably includes transparent materials, such as Indium Tin Oxide (ITO), Indium Zinc Oxide (IZO). The transparent materials not only are suitable as the light sensing surface, but also can be integrated in the manufacturing process of the TFT display. Accordingly, the photo sensor 100 can sense the light beams (front light beams) entering from the direction the second electrode 114, while the light beams (back light beams) coming from the direction of the first electrode 112 is blocked. Consequently, interference is prevented. In addition, the first electrode 112 and the second electrode 114 are formed by the deposition process to produce film layers and by the patterned process to generate the required pattern, but it is not limited herein.

The first silicon-rich dielectric layer 122 of this invention can include for instance a silicon-rich oxide ($SiO_{x1}$) layer, a silicon-rich nitride ($SiN_{y1}$) layer, a silicon-rich oxynitride ($SiO_{x1}N_{y1}$) layer, a silicon-rich carbon oxide ($SiO_{x1}C_{z1}$) layer or a silicon-rich carbide ($SiC_{z1}$) layer. The method of forming the first silicon-rich dielectric layer 122, for example the silicon-rich oxide ($SiO_{x1}$) layer, may include performing a plasma enhanced chemical vapor deposition process by using silane to react with a nitrous oxide ($N_2O$) source gas, and the flow ratio of silane to the $N_2O$ source gas is preferably substantially over 4.0 so that the first silicon-rich dielectric layer 122 has a preferred compound ratio. But it is not limited herein. For the silicon-rich nitride ($SiN_{y1}$) layer, the nitrogen source gas may be for instance at least one of ammonia ($NH_3$) and nitrogen ($N_2$), i.e. the nitrogen source gas may be ammonia or nitrogen, or a mixture thereof. Also, the nitrogen source gas may be other nitrogen-containing gas. According to the research result of this invention, the first percentage of silicon of the first silicon-rich dielectric layer 122 is preferably substantially higher than 55.6% and less than 100%, the refractive index of the first silicon-rich dielectric layer 122 is preferably substantially between 3.4 and 3.9, and the thickness of the first silicon-rich dielectric layer 122 is preferably substantially between 100 nanometers and 300 nanometers so as to provide better sensing effect and component reliability. Take the first silicon-rich dielectric layer 122 of the silicon-rich oxide layer ($SiO_{x1}$) as an example. The percentage of silicon $Cs_1$ is $1/(1+x1)$ and the percentage of oxygen $Cx_1$ is $x1/(1+x1)$, wherein $Cs_1+Cx_1=1$, $0<x1<2$, and preferably $0<x1<4/5$.

The second silicon-rich dielectric layer 124 of this invention can include for instance a silicon-rich oxide layer ($SiO_{x2}$), a silicon-rich nitride ($SiN_{y2}$) layer, a silicon-rich oxynitride ($SiO_{x2}N_{y2}$) layer, a silicon-rich carbon oxide ($SiO_{x2}C_{z2}$) layer or a silicon-rich carbide ($SiC_{z2}$) layer. The method of forming the second silicon-rich dielectric layer 124, for example the silicon-rich oxide layer ($SiO_{x2}$), may include performing a plasma enhanced chemical vapor deposition process by using silane to react with a $N_2O$ source gas, and the flow ratio of silane to the nitrogen source gas is preferably substantially over 1.2. But it is not limited herein. According to the research result of this invention, the second percentage of silicon of the second silicon-rich dielectric layer 124 is preferably substantially higher than 47.4% and less than 100%, the refractive index of the second silicon-rich dielectric layer is preferably substantially between 2.7 and 3.9, and the thickness of the second silicon-rich dielectric layer is preferably substantially between 100 nanometers and 300 nanometers so as to provide better photosensitive effect and component reliability. Take the second silicon-rich dielectric layer 124 of the silicon-rich oxide layer ($SiO_{x2}$) as an example. The percentage of silicon $Cs_2$ is $1/(1+x2)$ and the percentage of oxygen $Cx_2$ is $x2/(1+x2)$, wherein $Cs_2+Cx_2=1$, $0<x2<2$, and preferably $0<x2<10/9$.

In this embodiment, the second silicon-rich dielectric layer 124 is formed after the first silicon-rich dielectric layer 122, i.e., the first silicon-rich dielectric layer 122 is disposed between the first electrode 112 and the second electrode 114, and the second silicon-rich dielectric layer 124 is disposed between the first silicon-rich dielectric layer 122 and the second electrode 114. In other embodiments, the forming order of the first silicon-rich dielectric layer 122 and the second silicon-rich dielectric layer 124 may also exchange with each other. For example, the second silicon-rich dielectric layer 124 is formed firstly, so that the first silicon-rich dielectric layer 122 with higher percentage of silicon is disposed between the second silicon-rich dielectric layer 124 and the first electrode 112. According to the research result, no matter whether the first silicon-rich dielectric layer 122 or the second silicon-rich dielectric layer 124 is formed firstly, the single photo sensor 100 can effectively sense the signals of both the infrared ray and the visible light. It should be noted that the aforementioned forming method mainly provides the vertical multilayer stack photo sensor 100, and multiple deposition process and patterned process can be used to form the horizontal multilayer stack photo sensor in other embodiments of the invention without the limitation of the aforementioned forming order.

Figure 3:
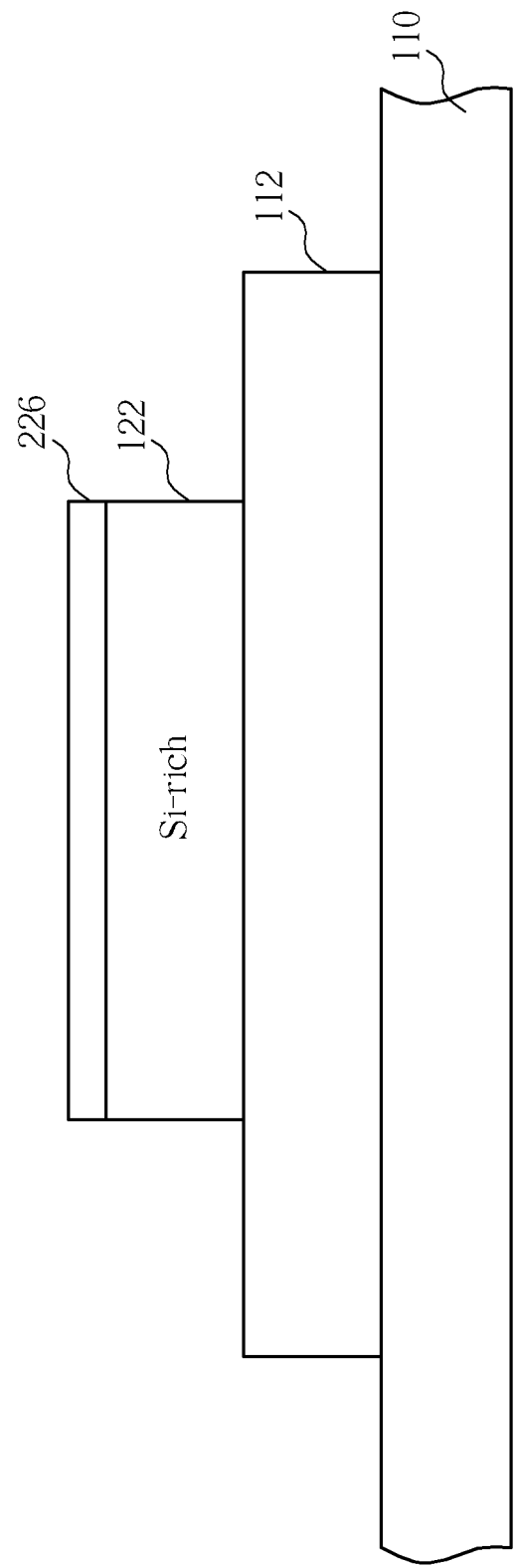
FIGS. 3-4 are schematic diagrams illustrating a method of forming the photo sensor according to another preferred embodiment of the present invention.
Figure 4:
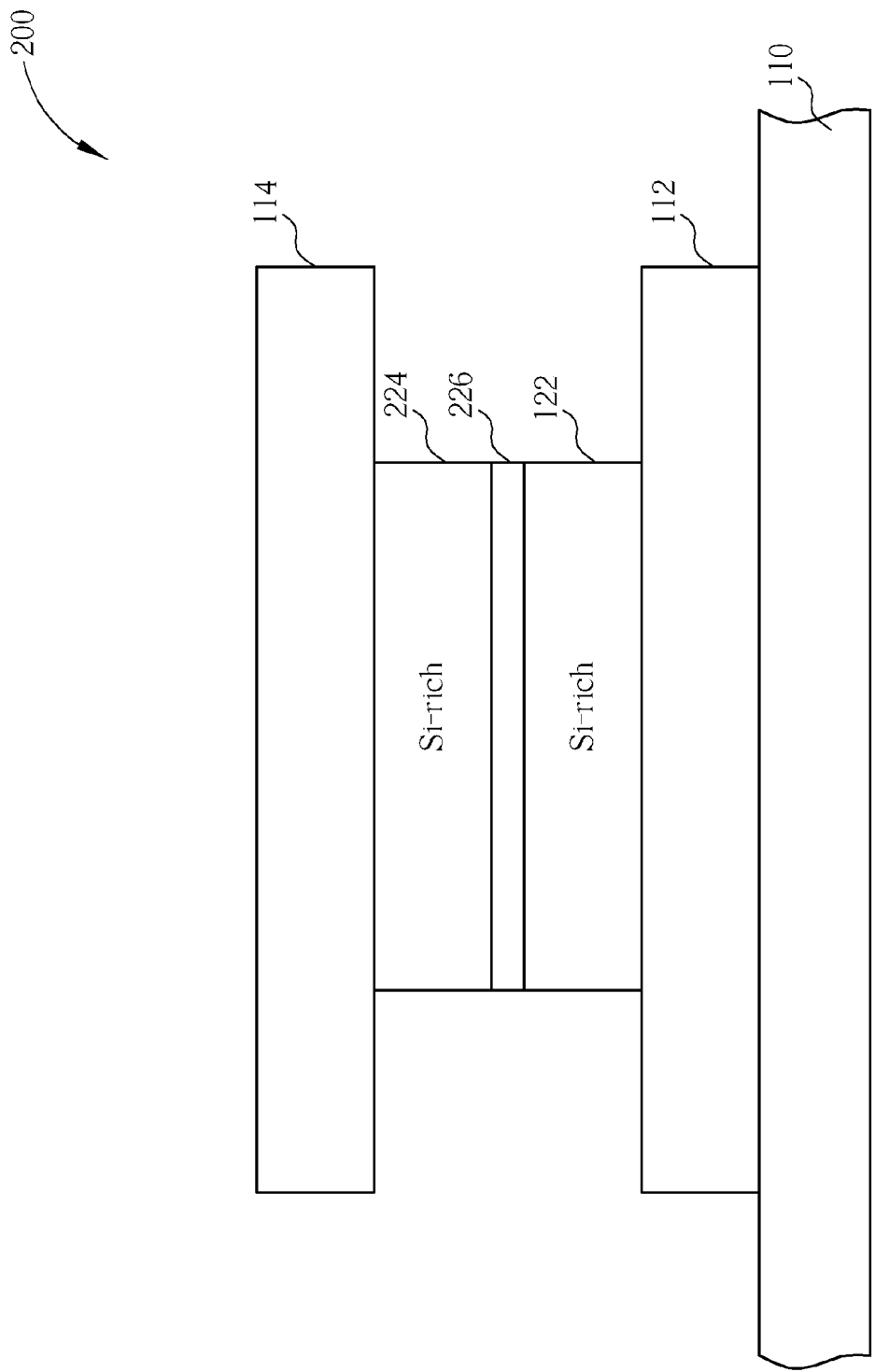

In addition, the photo-sensing composite structure of the aforementioned embodiment is mainly made of at least two different silicon-rich dielectric layers. In other embodiments, the photo-sensing composite structure of the invention may also be made of at least three different silicon-rich dielectric layers, or include the materials such as non-oxide, non-nitride, or non-oxynitride. Please refer to FIGS. 3-4. FIGS. 3-4 are schematic diagrams illustrating a method of forming the photo sensor according to another preferred embodiment of the present invention. For the comparison of the two embodiments, the same component is indicated as the same symbol, and only the difference of the two embodiments are explained as follows.

As shown in FIG. 3, the first electrode 112 and the first silicon-rich dielectric layer 122 are formed on the substrate 110, and then a semiconductor layer 226 is formed on the first silicon-rich dielectric layer 122. The thickness of the semiconductor layer 226 is preferably substantially between 10 nanometers and 30 nanometers. And the semiconductor layer 226 may be preferably a microcrystalline silicon (micro-Si) layer, a nanocrystalline silicon (nano-Si) layer, a polycrystalline silicon (poly-Si) layer, or an amorphous silicon (α-Si) layer, or a composite structure of the above materials. In this embodiment, the semiconductor layer 226 may preferably be a microcrystalline silicon layer or a nanocrystalline silicon layer. The microcrystalline silicon layer and the nanocrystalline silicon layer include microcrystalline silicon and nanocrystalline silicon respectively so as to provide high photosensitive efficiency and high conversion efficiency. The method of forming the semiconductor layer 226 includes for instance performing a plasma enhanced chemical vapor deposition process to deposit the semiconductor layer 226 by using hydrogen to react with silane, and the flow ratio of hydrogen to silane is preferably substantially over 8.0. But it is not limited herein.

As shown in FIG. 4, the second silicon-rich dielectric layer 224 is formed on the semiconductor layer 226 to sense the visible light beams, and then the second electrode 114 is formed to fabricate the photo sensor 200. Accordingly, the semiconductor layer 226 of this invention can dispose between the first silicon-rich dielectric layer 122 and the second silicon-rich dielectric layer 224, but it is not limited herein. In this embodiment, the suitable conditions of the second silicon-rich dielectric layer 224, such as material, compound ratio, forming method, refractive index, and thickness, can be the same as the suitable conditions of the first silicon-rich dielectric layer 122. For example, the first silicon-rich dielectric layer 122 and the second silicon-rich dielectric layer 224 of this embodiment preferably have similar or the same material and compound ratio, but it is not limited herein. No matter whether the first silicon-rich dielectric layer 122 and the second silicon-rich dielectric layer 224 are the same material layers or not, the composite structure of the first silicon-rich dielectric layer 122, the semiconductor layer 226, and the second silicon-rich dielectric layer 224 can provide the photo sensor 200. It can not only effectively sense the signals of the near-infrared ray, the infrared ray, and the visible light but also be easily integrated in the optical touch device.

Figure 5:
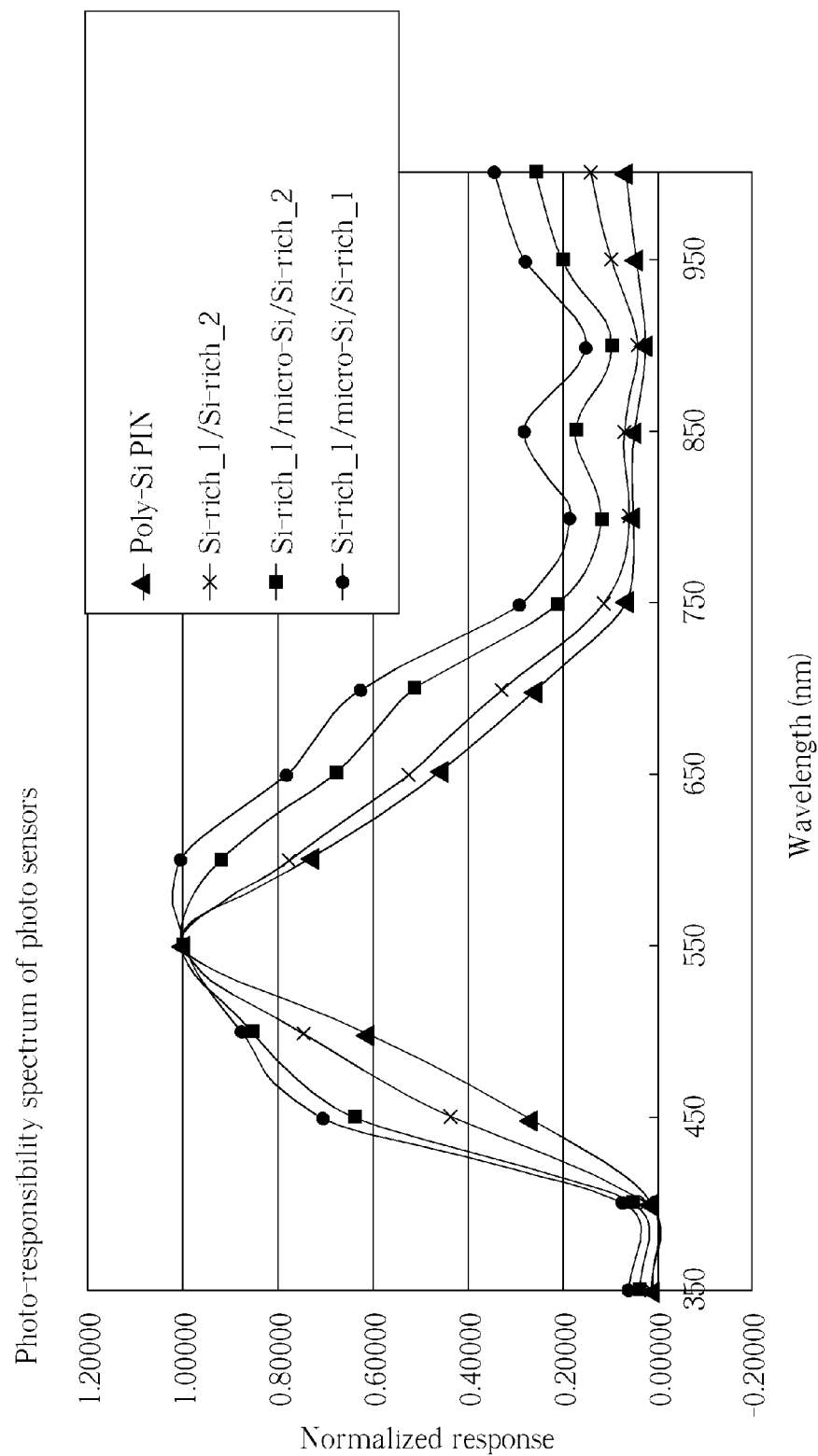
FIG. 5 is a photo-responsibility spectrum of PIN diode photo sensor and of the photo sensors according to the present invention.

Please refer to FIG. 5. FIG. 5 is a photo-responsibility spectrum of PIN diode photo sensor and of the photo sensors according to the present invention. The vertical coordinates represent the photo-responsibility spectrum of the photo sensor, and the horizontal coordinates represent the wavelength of the light. Poly-Si PIN is the photo-responsibility curve of the PIN diode photo sensor, Si-rich_1/Si-rich_2 is the photo-responsibility curve of the photo sensor 100 according to the present invention, Si-rich_1/micro-Si/Si-rich_2 and Si-rich_1/micro-Si/Si-rich_1 are the photo-responsibility curve of the photo sensors 200 according to the present invention. For the curve of Si-rich_1/micro-Si/Si-rich_2, the first percentage of silicon of the first silicon-rich dielectric layer 122 is substantially higher than 55.6%, the refractive index of the first silicon-rich dielectric layer 112 is substantially between 3.4 and 3.9, the second percentage of silicon of the second silicon-rich dielectric layer 224 is substantially higher than 47.4%, and the refractive index of the second silicon-rich dielectric layer 224 is substantially between 2.7 and 3.9. For the curve of Si-rich_1/micro-Si/Si-rich_1, the first silicon-rich dielectric layer 122 and the second silicon-rich dielectric layer 224 are the same material layer, and the percentage of the material layer is substantially higher than 55.6%.

As shown in FIG. 5, no matter whether in the visible light range (substantially between 380 nanometers and 780 nanometers) or in the near-infrared range (substantially between 780 nanometers and 2500 nanometers), the photo-sensitive effect of the photo sensor 100 and the photo sensor 200 according to the invention is better than the photosensitive effect of the PIN diode photo sensor. Based on the photosensitive curves, the photosensitive effect of each photo sensor is arranged in a series from low to high: Poly-Si PIN<Si-rich_1/Si-rich_2<Si-rich_1/micro-Si/Si-rich_2<Si-rich_1/micro-Si/Si-rich_1. Especially, the photo sensor 200 having the semiconductor layer 226 (Si-rich_1/micro-Si/Si-rich_2 and Si-rich_1/micro-Si/Si-rich_1) has better ability to sense the near-infrared ray with the wavelength around 850 nanometers, but the PIN diode photo sensor has worse ability to sense the infrared ray.

Figure 6:
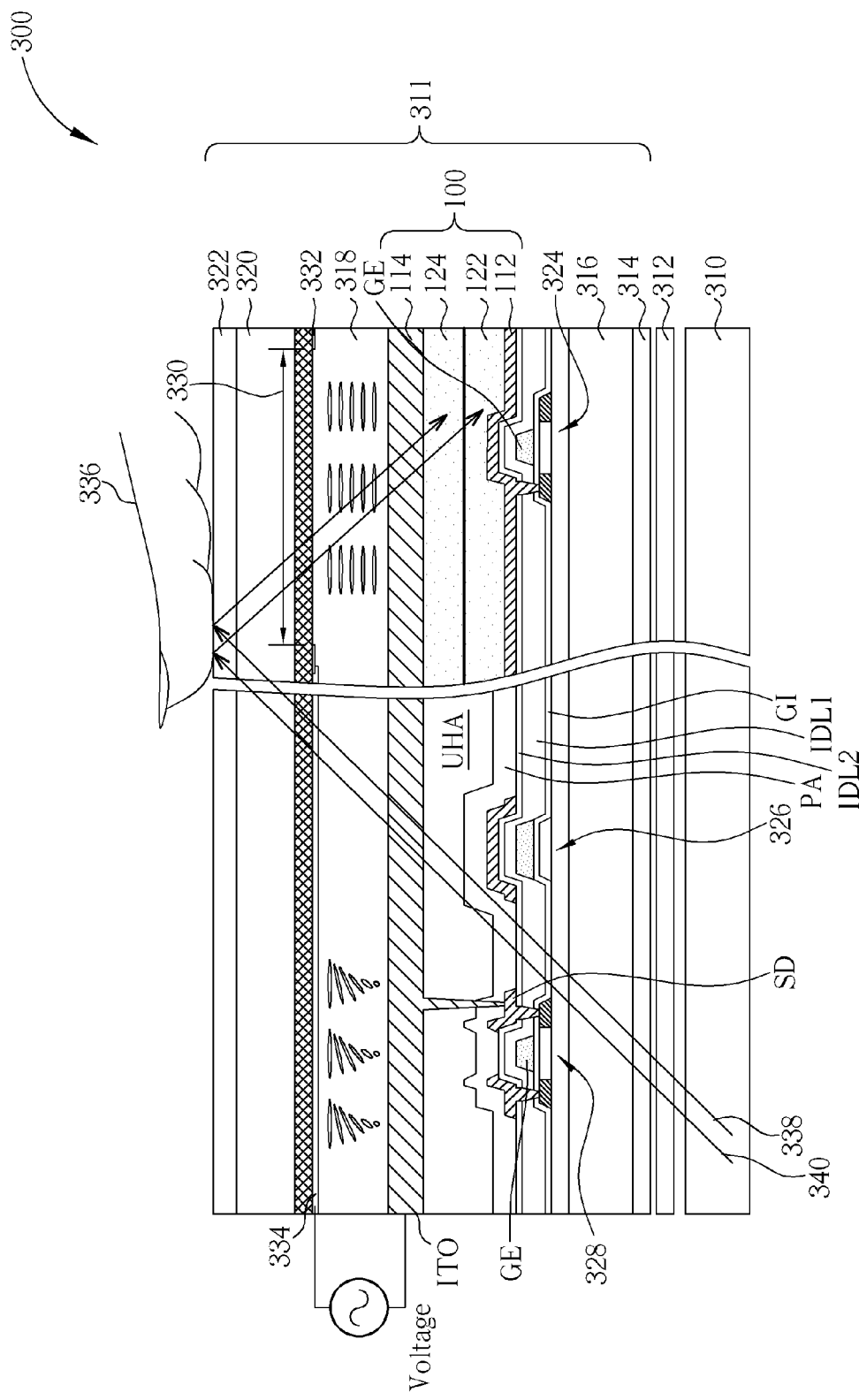
FIG. 6 is a schematic diagram illustrating a photo sensor integrated into an optical touch device according to a preferred embodiment of the present invention.

Please refer to FIG. 6. FIG. 6 is a schematic diagram illustrating a photo sensor integrated into an optical touch device according to a preferred embodiment of the present invention. As shown in FIG. 6, according to the preferred embodiment, the photo sensor 100 is integrated into the optical touch device 300, such as low temperature poly-Si TFT liquid crystal display device. The optical touch device 300 may include a light source generating device 310, a display panel 311, and an optical film layer 312, such as a diffuser. The display panel 311 includes the display component and the aforementioned photo sensor 100. The display component may include a color filter substrate, an array substrate, and a liquid crystal layer 318 disposed between the color filter substrate and the array substrate. The color filter substrate may include a transparent substrate 320, a polarizer 322, a black matrix 332 and a color filter 334. The aperture of the black matrix 332 can expose the photo-sensing area 330 and the aperture substantially disposes over the photo sensor 100.

The array substrate may include a plurality of layers such as a transparent substrate 316, a polarizer 314, a gate insulating layer GI, an oxide dielectric layer IDL1, a nitride dielectric layer IDL2, a gate electrode GE, a gate/drain line SD, a protective layer PA, a smooth layer UHA, and a patterned second electrode layer ITO. These layers are used to form for instance the drive TFT 328, the readout TFT 324, and the capacitor 326.

The photo sensor 100 disposes over the readout TFT 324 and can be integrated in the pixel structure forming process of the optical touch device 300. For example, in this embodiment, the first electrode 122 of the photo sensor 100, the gate/drain line SD of the drive TFT 328, and the capacitor 326 may be formed in the same electrode layer. The second electrode 114 of the photo sensor 100 and the pixel electrode of the drive TFT 328 may be form in the second electrode layer ITO. In addition, the manufacturing process of the readout TFT 324 may be integrated with the manufacturing process of the display region. For example, the gate electrode GE of the readout TFT 324 and the gate electrode GE of the drive TFT 328 may be formed in the same deposition process and patterning process.

Figure 7:
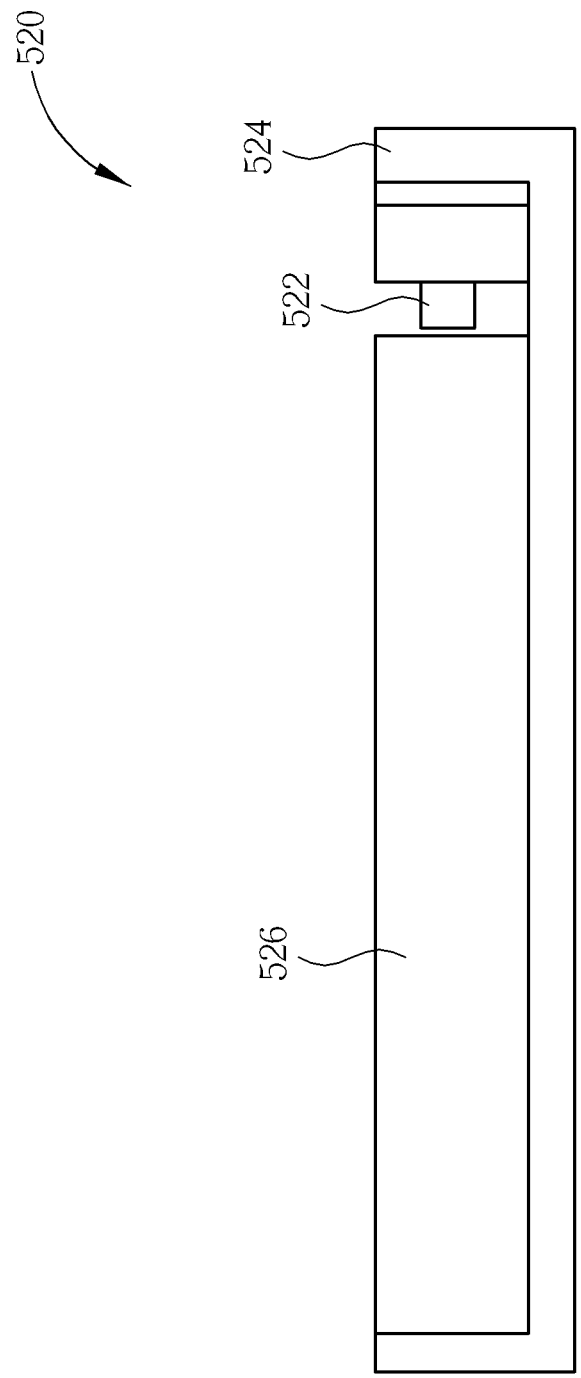
FIG. 7 is a schematic diagram illustrating an edge-type backlight module according to the present invention.
Figure 8:
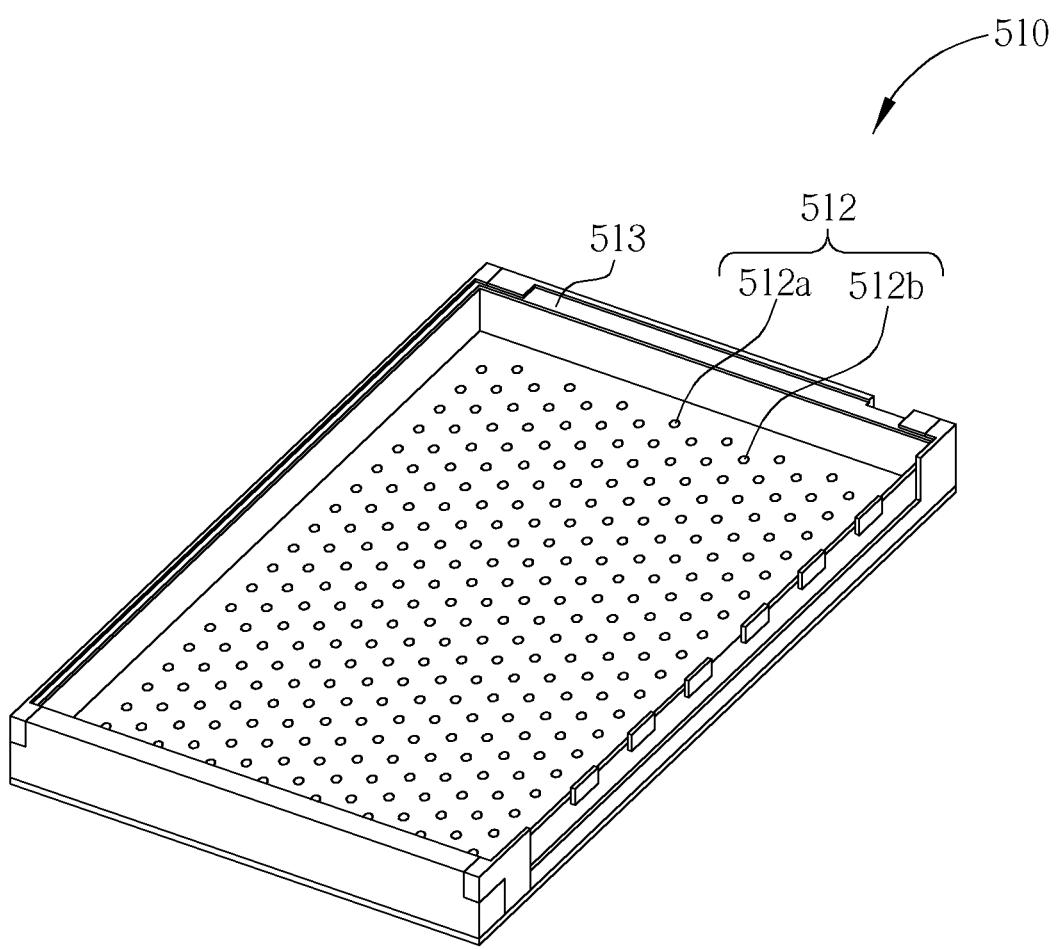
FIG. 8 is a schematic diagram illustrating a direct-type backlight module according to the present invention.

The light source generating device 310 of this embodiment may dispose under the display panel 311. The light source generating device 310 may include a visible light generating component and an infrared ray generating component (not shown in FIG. 6) to provide visible light beams and infrared rays respectively. Based on the type of the light source generating device 310, the light source generating device 310 may include an edge-type backlight module or a direct-type backlight module as shown in FIG. 7 and FIG. 8 respectively. In FIG. 7, the edge-type backlight module 520 includes a plurality of the light generating components 522, frames 524, and light guide plates 526. Some of the light generating components 522 may be visible light generating components, and some of the light generating components 522 may be infrared ray generating components. Only the single light generating component 522 is drawn in the figure, and other light generating components 522 are covered and not shown. In FIG. 8, the direct-type backlight module 510 includes a plurality of light generating components 512 and frames 513. Some of the light generating components 512 may be visible light generating components 512a, and some of the light generating components 512 may be infrared ray generating components 512b. The visible light generating components 512a and the infrared ray generating components 512b may be arranged in random, but it is not limited herein. The type and shape of the light generating components are not restricted by FIGS. 7-8. For example, the light generating components of the present invention may be light emitting diodes, cold cathode fluorescent lamps, or other suitable light sources.

Please refer to FIG. 6 again. The optical touch device 300 of the present invention may include a sealant (not shown in the figure) disposed between the cooler filter substrate and the array substrate. The photo sensor 100 may disposed inside the sealant of the display region and serve as the touch sensor. As shown in FIG. 6, when an object 336 approaches the optical touch device 300, the light beams (may include the visible light beam 338 and the infrared ray 340) emitted from the light source generating device 310 is reflected from the object 336 and toward the photo-sensing region 330 so as to be sensed by the photo sensor 100. The electron-hole pairs are excited in the photo sensor 100 to generate photo current. The photo current is then transformed into the signal by the readout device 30.

In other embodiments, the photo sensor 100 may also dispose outside the sealant and serve as an ambient light sensor. The photo sensor 100 is used as an ambient light sensor, such that the brightness of back light of the light source generating device 310 can be modified according to the intensity of ambient light to optimize the brightness of display images. Based on the demand of product design, usage environment, or process integration, the photo sensor 100 of the optical touch device 300 can be replaced by the photo sensor 200 or the photo sensors of the aforementioned embodiments.

Figure 9:
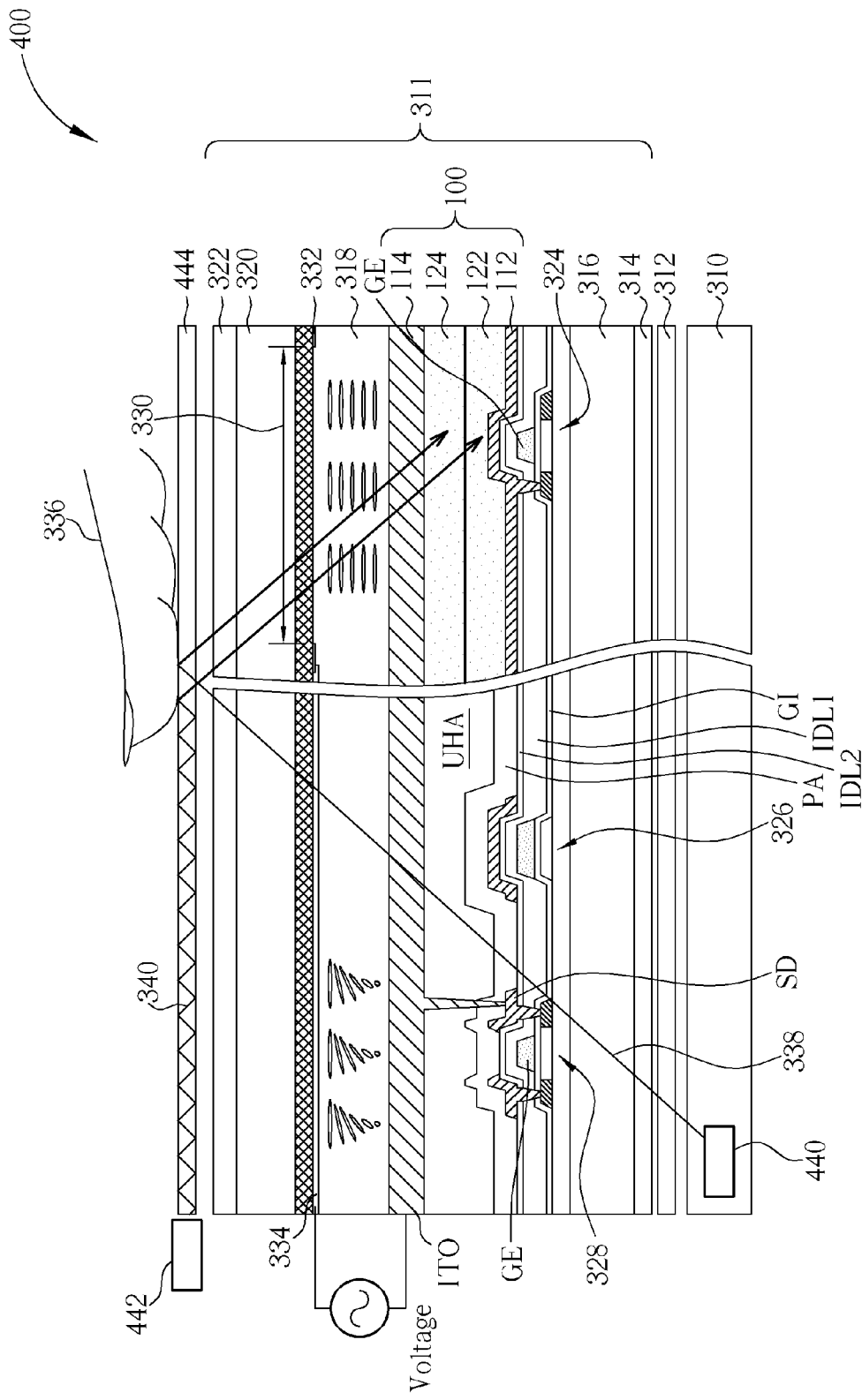
FIG. 9 is a schematic diagram illustrating an optical touch device according to another preferred embodiment of the present invention.

In other embodiments, the light source generating devices may be other types. Please refer to FIG. 9. FIG. 9 is a schematic diagram illustrating an optical touch device according to another preferred embodiment of the present invention. For the comparison of the two embodiments, the same component is indicated as the same symbol, and only the difference of the two embodiments are explained as follows. As shown in FIG. 9, the light source generating device of the optical touch device 400 includes the visible light backlight module 410 disposed under the display panel 311. The visible light backlight module 410 may be a direct-type backlight module or an edge-type backlight module. The light source generating device also includes the infrared ray source module disposed over the display panel 311. The infrared ray source module at least includes an infrared ray generating component 442 and a light guide plate 444. Accordingly, the light source generating device can provide the visible light beam 338 and the infrared ray 340 over and under the display panel 311 to serve as the light source of the photo sensor 100.

Figure 10:
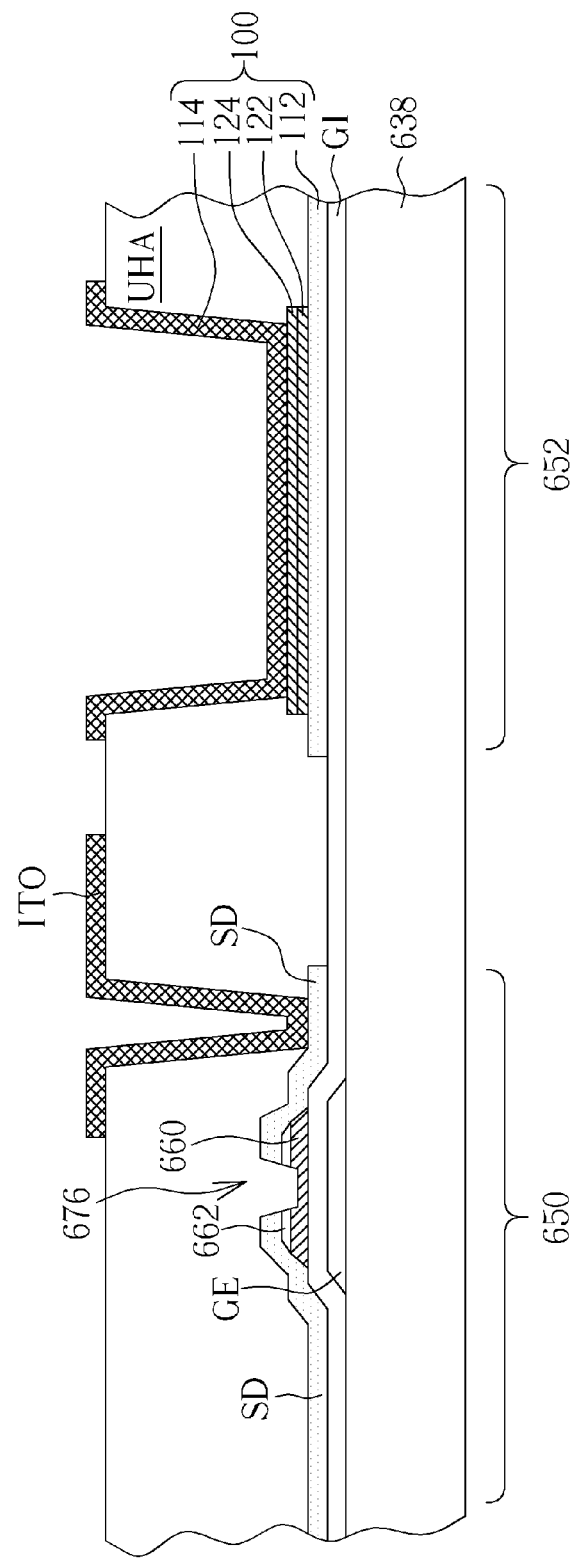
FIG. 10 is a schematic diagram illustrating a photo sensor integrated into an optical touch device according to another preferred embodiment of the present invention.

In addition to the aforementioned low temperature poly-Si TFT liquid crystal display device, the photo sensor of the present invention may also be integrated into the amorphous silicon TFT liquid crystal display device. Please refer to FIG. 10. FIG. 10 is a schematic diagram illustrating a photo sensor integrated into an optical touch device according to another preferred embodiment of the present invention, wherein only some of the display components and photo sensors on the array substrate are drawn in this embodiment, and other components of the light source generating device, such as a light source generating device, a color filter substrate, a capacitor, and an optical film layer. As shown in FIG. 10, the array substrate may include a plurality of layers such as a transparent substrate 638, a gate insulating layer GI, a gate electrode GE, a gate/drain line SD, a patterned amorphous silicon layer 660, a doping amorphous silicon layer 662, a smooth layer UHA, and a patterned second electrode layer ITO. At least a TFT region 650 and at least a photo-sensing region 652 can be defined on the array substrate, and the aforementioned film layers can form the drive TFT 676 in the TFT region 650 and form the photo sensor 100 in the photo-sensing region 652.

In the same way, the first electrode 122 of the photo sensor 100 and the gate/drain line SD of the drive TFT 676 may be formed in the same electrode layer, and the second electrode 114 of the photo sensor 100 and the pixel electrode ITO of the drive TFT 676 are formed in the same electrode layer for the purpose of the manufacturing integration.

In conclusion, by the composite structure of the first silicon-rich dielectric layer and the second silicon-rich dielectric layer, the single photo sensor of the present invention can effectively sense the signals of the near-infrared ray, the infrared ray, and the visible light. In addition, the optical sensor of the present invention is more easily integrated into the optical touch device. So it not only simplifies the process and structure of the optical touch device but also is suitable to form optical touch panel integrated on glass.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of forming a photo sensor, comprising:
providing a substrate, and forming a first electrode on the substrate;
forming a first silicon-rich dielectric layer on the first electrode for sensing infrared rays, wherein the first silicon-rich dielectric layer comprises a silicon-rich oxide layer, a silicon-rich nitride layer, or a silicon-rich oxynitride layer;

forming a second silicon-rich dielectric layer on the first silicon-rich dielectric layer for sensing visible light beams, wherein the second silicon-rich dielectric layer comprises a silicon-rich oxide layer, a silicon-rich nitride layer, or a silicon-rich oxynitride layer; and forming a second electrode on the second silicon-rich dielectric layer.

2. The method of claim 1, wherein the first silicon-rich dielectric layer has a first percentage of silicon, the second silicon-rich dielectric layer has a second percentage of silicon, and the first percentage of silicon of the first silicon-rich dielectric layer is higher than the second percentage of silicon of the second silicon-rich dielectric layer.

3. The method of claim 1, wherein t the first percentage of silicon of the first silicon-rich dielectric layer is substantially higher than 55.6% and less than 100%, and the second percentage of silicon of the second silicon-rich dielectric layer is substantially higher than 47.4% and less than 100%.

4. The method of claim 1, wherein a refractive index of the first silicon-rich dielectric layer is higher than a refractive index of the second silicon-rich dielectric layer.

5. The method of claim 1, wherein forming the first silicon-rich dielectric layer comprises performing a plasma enhanced chemical vapor deposition process to deposit the first silicon-rich dielectric layer by using silane to react with a $N_2O$ source gas, and the flow ratio of silane to the $N_2O$ source gas is substantially over 4.0.

6. The method of claim 1, wherein a refractive index of the first silicon-rich dielectric layer is substantially between 3.4 and 3.9.

7. The method of claim 1, wherein a thickness of the first silicon-rich dielectric layer is substantially between 100 nanometers and 300 nanometers.

8. The method of claim 1, wherein forming the second silicon-rich dielectric layer comprises performing a plasma enhanced chemical vapor deposition process to deposit the second silicon-rich dielectric layer by using silane to react with a $N_2O$ source gas, and the flow ratio of silane to the $N_2O$ source gas is substantially over 1.2.

9. The method of claim 1, wherein a refractive index of the second silicon-rich dielectric layer is substantially between 2.7 and 3.9.

10. The method of claim 1, wherein a thickness of the second silicon-rich dielectric layer is substantially between 100 nanometers and 300 nanometers.

11. The method of claim 1, further comprising forming a semiconductor layer, wherein the semiconductor layer is disposed between the first silicon-rich dielectric layer and the second silicon-rich dielectric layer.

12. The method of claim 11, wherein the semiconductor layer comprises a microcrystalline silicon layer, a nanocrystalline silicon layer, a polycrystalline silicon layer, or an amorphous silicon layer.

13. The method of claim 11, wherein forming the semiconductor layer comprises performing a plasma enhanced chemical vapor deposition process to deposit the semiconductor layer by using hydrogen to react with silane, and the flow ratio of hydrogen to silane is substantially over 8.0.

14. The method of claim 11, wherein a thickness of the semiconductor layer is substantially between 10 nanometers and 30 nanometers.

15. An optical touch device, comprising:
a light source generating device comprising a visible light generating component to provide visible light beams and an infrared ray generating component to provide infrared rays; and
a display panel comprising a display component and a photo sensor, wherein the photo sensor comprises:
a first electrode;
a second electrode;
a first silicon-rich dielectric layer disposed between the first electrode and the second electrode for sensing an infrared ray, wherein the first silicon-rich dielectric layer comprises a silicon-rich oxide layer, a silicon-rich nitride layer, or a silicon-rich oxynitride layer; and
a second silicon-rich dielectric layer disposed between the first silicon-rich dielectric layer and the second electrode for sensing a visible light, wherein the second silicon-rich dielectric layer comprises a silicon-rich oxide layer, a silicon-rich nitride layer, or a silicon-rich oxynitride layer.

16. The optical touch device of claim 15, wherein the light source generating device comprises a direct-type backlight module disposed under the display panel.

17. The optical touch device of claim 15, wherein the light source generating device comprises an edge-type backlight module disposed under the display panel.

18. The optical touch device of claim 15, wherein the light source generating device comprises a visible light backlight module disposed under the display panel and an infrared ray source module disposed over the display panel.

* * * * *